(12) United States Patent
Chen et al.

(10) Patent No.: US 7,910,937 B2
(45) Date of Patent: Mar. 22, 2011

(54) METHOD AND STRUCTURE FOR FABRICATING III-V NITRIDE LAYERS ON SILICON SUBSTRATES

(75) Inventors: Peng Chen, Singapore (SG); Soo Jin Chua, Singapore (SG); Zhonglin Miao, Singapore (SG); Sudhiranjan Tripathy, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 67 days.

(21) Appl. No.: 11/344,472

(22) Filed: Feb. 1, 2006

(65) Prior Publication Data

US 2006/0191474 A1 Aug. 31, 2006

Related U.S. Application Data

(60) Provisional application No. 60/648,710, filed on Feb. 2, 2005.

(51) Int. Cl.
*H01L 33/00* (2010.01)
(52) U.S. Cl. .......... 257/96; 257/103; 257/E33.028; 257/E33.034; 257/190; 257/200; 438/94
(58) Field of Classification Search .......... 257/96; 438/94
See application file for complete search history.

(56) References Cited

U.S. PATENT DOCUMENTS

| 5,239,188 A | * | 8/1993 | Takeuchi et al. | ................ 257/76 |
| 6,391,748 B1 | * | 5/2002 | Temkin et al. | ................ 438/478 |
| 2002/0020341 A1 | | 2/2002 | Marchand et al. | |

OTHER PUBLICATIONS

Lu et al., "The growth morphologies . . . substrate" Journal of Crystal Growth, 247 (2003) pp. 91-98 Elsevier.*
Nikishin, Sergey A. et al., "High Quality AlN and GaN Grown on Si(111) by Gas Source Molecular Beam Epitaxy with Amonia", MRS Fall Meeting, F99W8.3, 1999.
Calleja, E. et al., "Growth of III-nitrides on Si(111) by molecular beam epitaxy Doping, optical and electrical properties", Journal of Crystal Growth 201/202, pp. 296-317, 1999.
Lahreche, H. et al., "Optimisation of AlN and GaN growth by metalorganic vapour-phase epitaxy (MOVPE) on Si(111)", Journal of Growth 217, pp. 13-25, 2000.
Chen, P. et al., "Growth of high quality GaN layers with AlN buffer on Si(111) substrates", Journal of Growth 255, pp. 150-154, 2001.
Waldrip, K. E., et al., "Stress engineering during metalorganic chemical vapor deposition of AlGaN/GaN distributed Bragg reflectors", Applied Physics Letters, vol. 78, No. 21, pp. 3205-3207, May 21, 2001.
S. A. Nikishin et al., "High quality GaN grown on Si(111) by gas source molecular beam epitaxy with ammonia," Applied Physics Letters, vol. 75, No. 14, Oct. 4, 1999, pp. 2073-2075.

(Continued)

*Primary Examiner* — Jerome Jackson, Jr.
(74) *Attorney, Agent, or Firm* — Birch, Stewart, Kolasch & Birch, LLP (57) ABSTRACT

A method and structure for fabricating III-V nitride layers on silicon substrates includes a substrate, a transition structure having AlGaN, AlN and GaN layers, and a superlattice structure having AlGaN and GaN layers. In the invention, the large lattice mismatch (17%) between GaN and silicon is solved by using AlN as the first buffer layer with a 5:4 coincidence between AlN(0001) and Si(111) lattice to reduce the lattice mismatch to 1.3%.

14 Claims, 11 Drawing Sheets

OTHER PUBLICATIONS

S. Guha et al., "Selective area metalorganic molecular-beam epitaxy of GaN and the growth of luminescent microcolumns on Si/SiO2", Applied Physics Letters, vol. 75, No. 4, Jul. 26, 1999, pp. 463-465.

S. Tripathy et al., "Micro-Raman investigation of strain in GaN and AlxGa1-xN/GaN heterostructures grown on Si(111)," Journal of Applied Physics, vol. 92, No. 7, Oct. 1, 2002, pp. 3503-3510.

Supratik Guha et al., "Multicolored light emitters on silicon substrates," Applied Physics Letters, vol. 73, No. 11, Sep. 14, 1998, pp. 1487-1489.

Supratik Guha et al., "Ultraviolet and violet GaN light emitting diodes on silicon", Applied Phyics Letters, vol. 72, No. 4, Jan. 26, 1998, pp. 415-417.

* cited by examiner

METHOD AND STRUCTURE FOR FABRICATING III-V NITRIDE LAYERS ON SILICON SUBSTRATES

This application claims priority under 35 U.S.C. §120 of provisional application No. 60/648,710, filed on Feb. 2, 2005, the entire contents of which are hereby incorporated by reference.

BACKGROUND OF THE INVENTION

1. Field of the Invention

High quality epitaxial III-V nitride layers of monocrystalline materials are grown on silicon substrates using buffer growth techniques.

2. Description of the Related Art

In the field of group III-V nitrides grown on Si substrates, high quality nitride films and relevant structures are necessary to improve the performance of semiconductor devices. Currently, semiconductor devices having nitride layers with high compatibility with the silicon substrate are difficult to achieve.

The problems associated with the related art technologies of growing nitrides on silicon include:

1) The large lattice mismatch (17%) between GaN and silicon;
2) The large thermal mismatch (30%~50%) between GaN and silicon;
3) The poor wetting of GaN on silicon substrate;
4) The nitridation of the Si surface during the growth of nitrides by using ammonia; and
5). High density cracking of nitride films grown on the Si substrate.

Additional disadvantages associated with the related art technology include high cost, insufficient substrate size and difficulties of integration with Si-based electronic devices. These problems must be overcome in order for the technology to supplant other technologies where sapphire or SiC is used as a substrate.

Thus, effective technology obtaining nitrides on silicon is highly desired.

SUMMARY OF THE INVENTION

It is accordingly an object of the invention to overcome the disadvantages of the related art.

It is an object of the invention to provide high quality epitaxial III-V nitride layers of monocrystalline materials that can be grown on overlying large silicon wafers by first growing an transition structure as the buffer on a silicon substrate by using a metal organic chemical vapor deposition (MOCVD) technique. The transition structure consists of at least three layers of monocrystalline material spaced apart from the silicon substrate by aluminium nitride, AlN, layers grown at different temperatures. The transition structure compensates thermal strain and reduces the lattice mismatch between gallium nitride, GaN, and silicon, and then, permits the growth of a high quality monocrystalline GaN and other III-V nitride layers. Utilizing this technique/structure permits the fabrication of semiconductor structures formed by high quality III-V nitride layers on silicon wafers.

The invention, in part, is directed at overcoming the large lattice (17%) and thermal mismatch (30%~50%) between GaN and silicon result in high-density dislocations and film cracking of heteroepitaxially grown GaN on silicon. Another problem the invention solves is the poor wetting of GaN on silicon substrates, which impedes the direct nucleation and frequently results in poor quality and morphology of GaN film. The invention overcomes these problems by providing unique buffer growth techniques and a combination structure as buffer on silicon.

In the invention, in a first step the silicon wafer is chemically etched to produce a hydrogen-terminated surface, which removes surface defects and amorphous native oxides in the ordinary surface of silicon in the air. The presence of such oxides makes epitaxial crystal growth impossible. After the chemical cleaning, the silicon wafer is loaded in a MOCVD chamber and heated to above about 1300° K. In a second step, the wafer is initially subjected to a flux of aluminium precursor without ammonia for a few seconds. After the surface of the silicon is covered with about 1~2-monolayers of aluminium, the wafer is further subjected to a flux of ammonia and aluminium applied simultaneously to continue the epitaxial growth process at temperatures in excess of about 1300° K. The process suppresses the formation of amorphous silicon nitride, $SiN_x$, compounds on the surface of the silicon that form due to the reaction between silicon and ammonia in the MOCVD chamber at high temperature. High quality AlN can be obtained on the surface free of amorphous silicon nitride. In a third step, after the AlN layer is grown on the silicon wafer, the structure is subjected to a various fluxes of Ga, Al and ammonia to form a layer of aluminium gallium nitride, AlGaN, with varied aluminium composition, x. The thickness of the AlGaN is proportional to the reciprocal of x. This AlGaN layer introduces a compressive strain to the upper surface of the structure so far. In a fourth step, the wafer is subjected to a flux of ammonia and aluminium only to grow a thin AlN layer at the temperatures of about 900±20° K. Then, the flux is change to gallium and ammonia to continue the epitaxial growth of GaN at the temperatures of about 1300±20° K. The AlN layers provide compressive strain to the top layer further. A fifth step repeats the fourth step, and it can be repeated more than one time. Within the repeated structure, dislocations generated at the surface of silicon are also at least partially stopped at the AlN/GaN interfaces. In a sixth step, an AlGaN/GaN superlattice having greater than about five, preferably ten, periods is grown on the top of GaN at temperatures of about 1300±20° K. The superlattice structure absorbs dislocations and decreases the dislocation density once more. Finally, in a seventh step, GaN is grown at the temperatures of about 1300±20° K, if desired. In this way, high quality epitaxial layers of III-V nitrides, such as AlGaN or indium gallium nitride, InGaN, can be grown on a silicon wafer by MOCVD technique using ammonia as the nitrogen source.

It is to be understood that both the foregoing general description and the following detailed description are exemplary and explanatory and are intended to provide further explanation of the invention as claimed.

BRIEF DESCRIPTION OF THE DRAWINGS

The accompanying drawings are included to provide a further understanding of the invention. The drawings illustrate embodiments of the invention and together with the description serve to explain the principles of the embodiments of the invention.

FIGS. 3a-3f illustrates the process of the growth of the transition structure on a silicon substrate in accordance with the present invention;

FIGS. 7(a)-7(b) are an optical micrograph of the surface morphology of a comparative GaN layer with a thin AlN buffer only on a silicon substrate (a) and one optical micrograph of the surface morphology of a GaN layer with the transition structure on a silicon substrate in accordance with the present invention (b);

DETAILED DESCRIPTION

Advantages of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Figure 1:
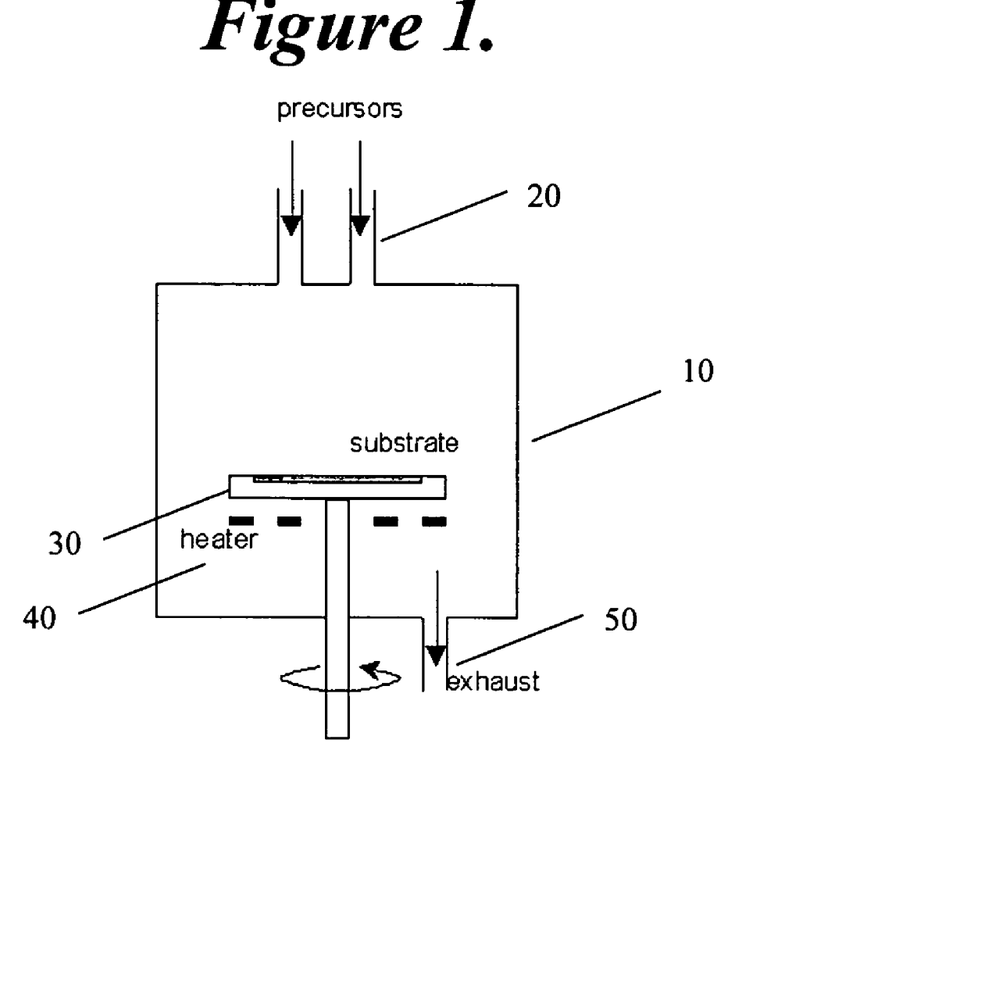
FIG. 1 illustrates a schematic drawing of growth furnace of an MOCVD apparatus used in examples of the present invention.

A process for producing nitride layers on silicon substrates by using a MOCVD technique is illustrated in FIG. 1, in which a surface nitridation of the silicon substrate due to the presence of ammonia and film cracking caused by large thermal mismatch between silicon and GaN have previously been major sources of problems in the related art, yielding poor quality product.

FIG. 1 illustrates a schematic drawing of growth furnace of an MOCVD apparatus used in examples of the present invention. In a reaction chamber 10, inlets 20 allow the introduction of precursors that can impinge on a substrate mounted on a stage 30. The state 30 can rotate. A heater 40 can raise the temperature to the desired range to allow the precursors to interact with the substrate. The chamber 10 is vented via the exhaust 50.

Figure 2:
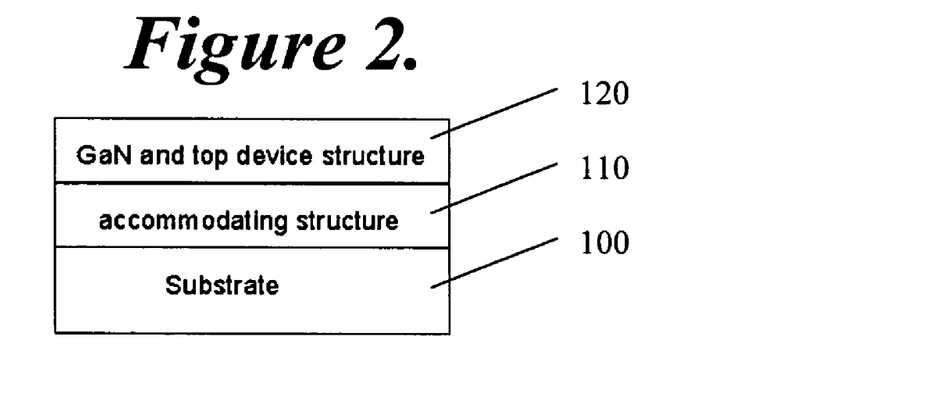
FIG. 2 is a schematic drawing of an epitaxial transition structure according to an embodiment of the present invention.

FIG. 2 shows an epitaxial transition structure according to an embodiment of the present invention. Over a substrate 100 is formed an accommodating structure 110 and a GaN and top device structure 120.

Figure 3A:
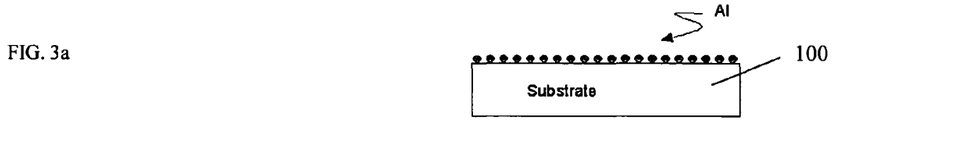
FIG. 3a illustrates the pre-seeding Al to a Si(111) surface without background ammonia.
Figure 3B:
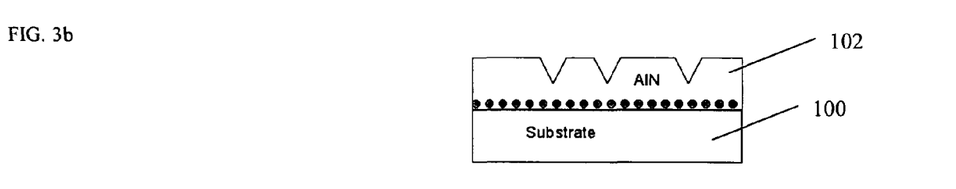
FIG. 3b illustrates the growth of the first layer of AlN on Si(111) arising after the Al pre-seeding with background ammonia and the formation of 2D AlN platforms during the growth of AlN.
Figure 3C:
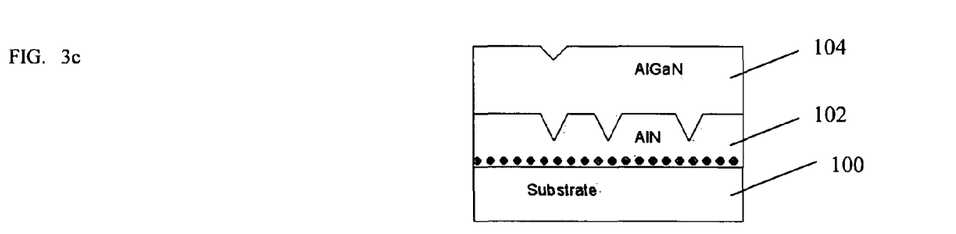
FIG. 3c illustrates 2D growth of AlGaN with different aluminium composition corresponding to the layer thickness on the AlN mentioned above.
Figure 3D:
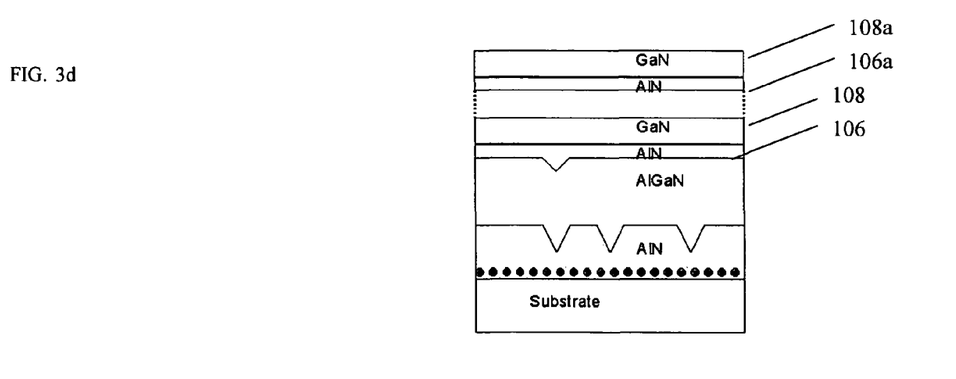
FIG. 3d illustrates the growth of the second AlN layer at relative low temperature and the growth of subsequent GaN. The bi-layer structure is repeated at least once.
Figure 3E:
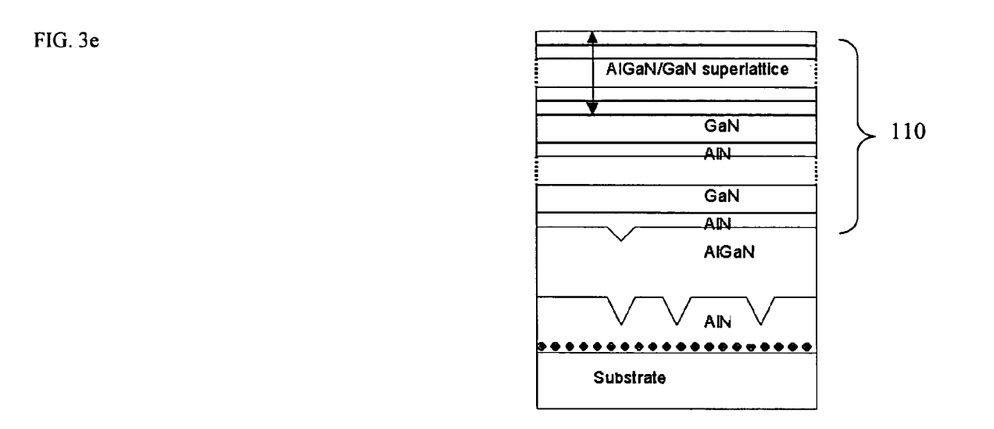
FIG. 3e illustrates the growth of the AlGaN/GaN superlattice having at least five periods.
Figure 3F:
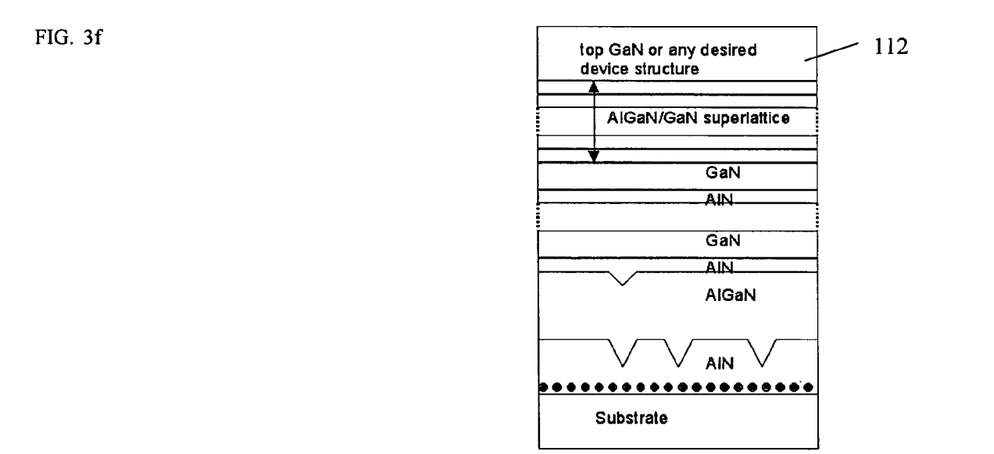
FIG. 3f illustrates the growth of the top GaN layer and or any desired device structure.

FIGS. 3a-3f illustrate the process of the growth of the transition structure on a silicon substrate 100 in accordance with a preferred embodiment of the present invention. As shown in FIG. 3a, Al is pre-seeded to a Si(111) surface without background ammonia. FIG. 3b shows the growth of a first layer of AlN 102 using background ammonia on the Si(111) substrate 100 after the background pre-seeding, and 2D AlN platforms are formed during the growth of AlN. As shown in FIG. 3d, the 2D growth of an AlGaN layer 104 proceeds with different aluminum composition corresponding to the layer thickness of the AlN layer 102. FIG. 3d shows the growth of a second AlN layer 106 at relative low temperature and the growth of the subsequent GaN layer 108. This bi-layer structure is repeated at least once 106a, 108a. A typical resulting structure is formed by growing a AlGaN/GaN superlattice 110, as is shown in FIG. 3e. The AlGaN/GaN superlattice 110 can have ten periods, but the invention is not restricted to ten periods, and any appropriate number of periods can be formed. FIG. 3f shows the growth of a top GaN structure 112. Alternately any desired device structure can be formed over the superlattice.

In further detail, the inventive device and process includes, in part, initially subjecting the substrate to a flux of aluminium in order to suppress the formation of amorphous SiNx, growing AlN at more than 1300° K to achieve monocrystalline AlN, and then repeating precisely designed multiple layers to compensate the thermal stress from the substrate. Finally, the improved process allows growth of high quality nitrides on silicon substrates, as illustrated in FIG. 2. In one of the preferred embodiments of the invention, epitaxial growth is performed on the top surface of a 2-inch Si(111) wafer.

The silicon wafer may be first prepared by wet chemical etching, such as an RCA-type etch. A preferred chemical etching process including two main steps: (i) formation of an about 1-2 nm thick SiO$_2$ layer by boiling in a solution of HCl:H$_2$O$_2$:H$_2$O (1:2:5); and (ii) formation of a hydrogen saturated surface by etching in a water solution of HF (10:1), resulting in a hydrogen-terminated surface. Then, the silicon wafer is transferred to MOCVD load chamber.

The silicon wafer is further prepared to result in the desorption of hydrogen and formation of a clean silicon surface by heating to about 1300° K for a few minutes. Formation of this surface signifies a Si(111) surface reconstruction transition from 7×7 to 1×1. This 1×1 surface reconstruction of Si(111) provides a transition surface lattice structure for the subsequent growth of AlN as described later on.

Once the clean silicon surface is prepared, a flux of aluminium precursor without ammonia initially subjects to the surface for a few seconds, which results in a few monolayers aluminium covering the Si surface. The aluminum precursor may be trimethyl aluminum (TMA). After the surface of the silicon wafer is preferably covered with 1~2-monolayers of aluminium, the wafer is further subjected to a flux of ammonia and aluminium precursor applied simultaneously to continue the epitaxial growth process of AlN. Since the Si surface is exposed to the background ammonia on heating the substrate to the growth temperature, the resulting formation of Si—N bonds cannot be prevented. The coverage of a few monolayers of aluminum protects the wafer surface. This process suppresses the formation of amorphous silicon nitride, SiNx, compounds on the surface of the silicon that form due to the reaction between silicon and ammonia in the MOCVD chamber at high temperature.

Figure 15:
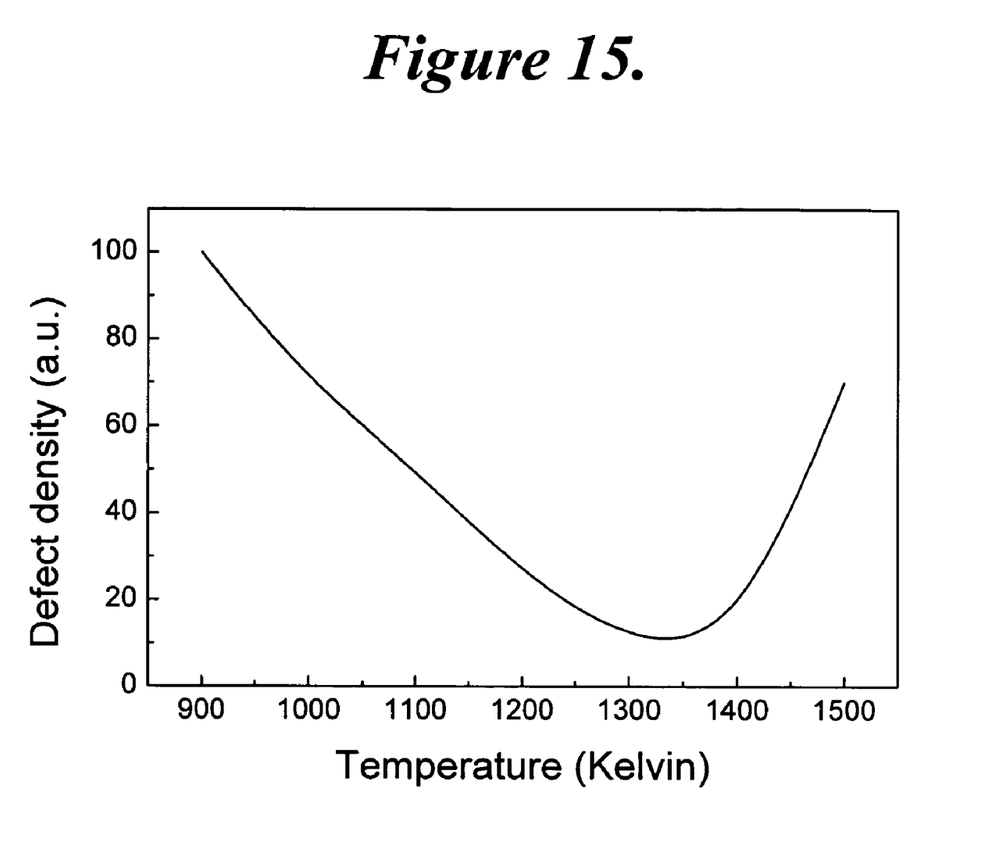
FIG. 15 shows the relationship between defect occurrence and AlN growth temperature.

In order to obtain the best epitaxial layer, subsequent AlN growth is carried out at a preferred temperature of not less than about 1300° K. The temperature where minimized defects (less than 20 a.u.) are observed is in the range of about 1200 to 1450° K, as is shown in FIG. 15. Due the absence of amorphous SiNx, the AlN shows a surface structure of 2-dimensional (2-D) growth, while the formation of SiNx leads to islands of AlN.

Figure 4A:
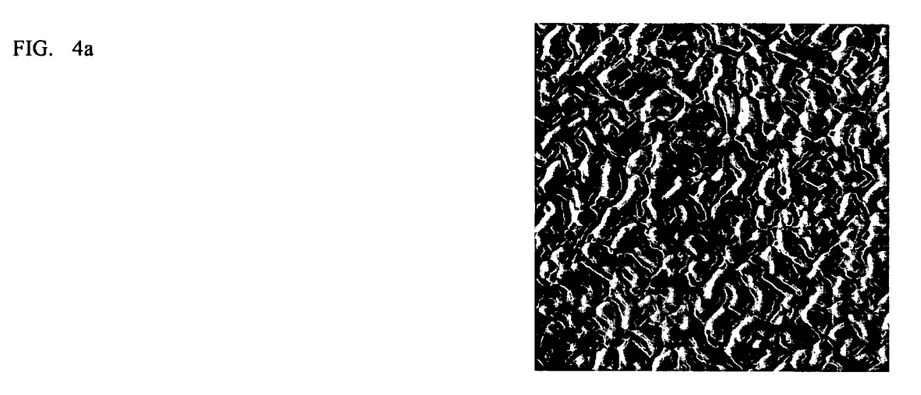
FIG. 4a is a 1.0 μm×1.0 μm Atomic Force Microscope (AFM) image of AlN grown under the optimized conditions of pre-seeding Al on a Si(111) wafer in accordance with the present invention.
Figure 4B:
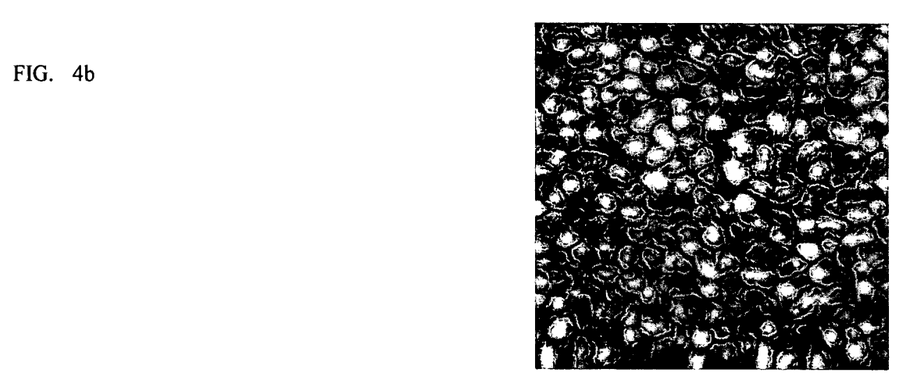
FIG. 4b is an 1.0 μm×1.0 μm AFM image of a comparative AlN grown without pre-seeding Al technique on a Si(111) wafer.

In order to confirm the formation of the 2-D surface structure, an atomic force microscopy (AFM) experiment was conducted on 70-nm AlN surfaced Si wafers processed with the pre-seeding Al technique compared to Si wafers that had not been seeded. The AFM morphology of AlN grown with the pre-seeding Al technique is illustrated in FIG. 4a. The surface shows a flat-topped terrace structure, which is a typical 2-D growth at this initial stage. The same thick AlN grown without the pre-seeding Al technique was also scanned using AFM, as is illustrated in FIG. 4b. The surface shows an island structure with various sizes, which is a typical 3-dimensional (3-D) growth.

Figure 5A:
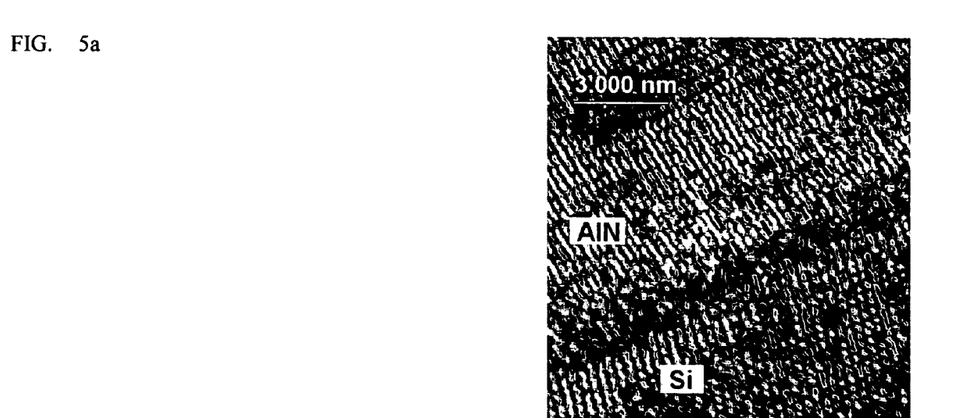
FIG. 5a is a high-resolution transmission electron microscopy image of the interface of AlN grown under the optimized conditions of pre-seeding Al on a Si(111) wafer in accordance with the present invention.

The interface structure of the AlN grown with the pre-seeding Al technique was observed by a transmission electron microscopy (TEM). FIG. 5a shows a high-resolution TEM image of the interface of AlN grown under the optimized conditions of pre-seeding Al on a Si(111) wafer. There is not any amorphous material existing at the AlN—Si interface. Furthermore, a coincidence of four lattice constants of Si in the (111) plane and five lattice constants of AlN in the (0001) plane is obtained. Such a commensurate relationship makes the effective lattice mismatch between AlN and Si greatly reduced compared to the bulk lattice constant mismatch.

Figure 5B:
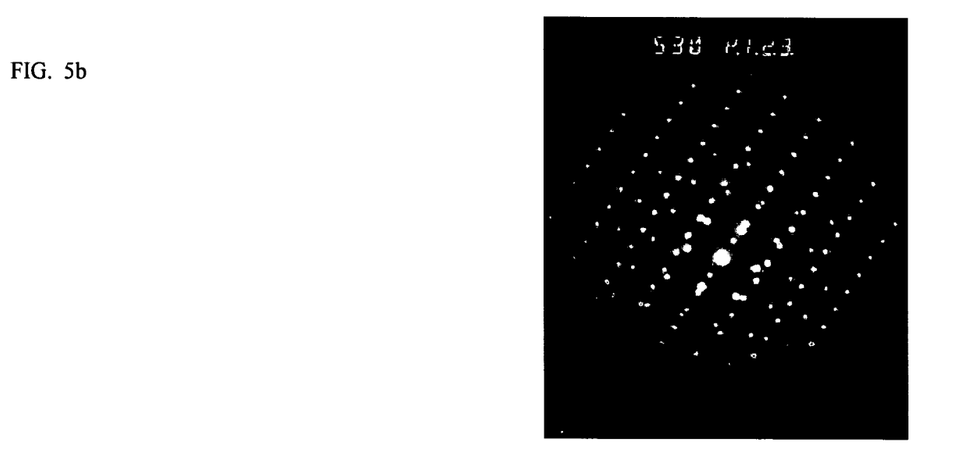
FIG. 5b is an electron selected-area diffraction pattern of the interface of AlN grown under the optimized conditions of pre-seeding Al on a Si(111) wafer in accordance with the present invention.

FIG. 5b shows an electron selected-area diffraction (SAD) pattern of the interface. Clear and regular SAD patterns indicate perfect crystal structures of AlN and Si, and there is no intermediate structure. The pre-seeding Al technique provides an effective method to avoid the formation of SiNx at the Si surface during the growth of AlN. The high preferred growth temperature of 1300° K leads to monocrystalline AlN on the Si (111) wafer.

Figure 6:
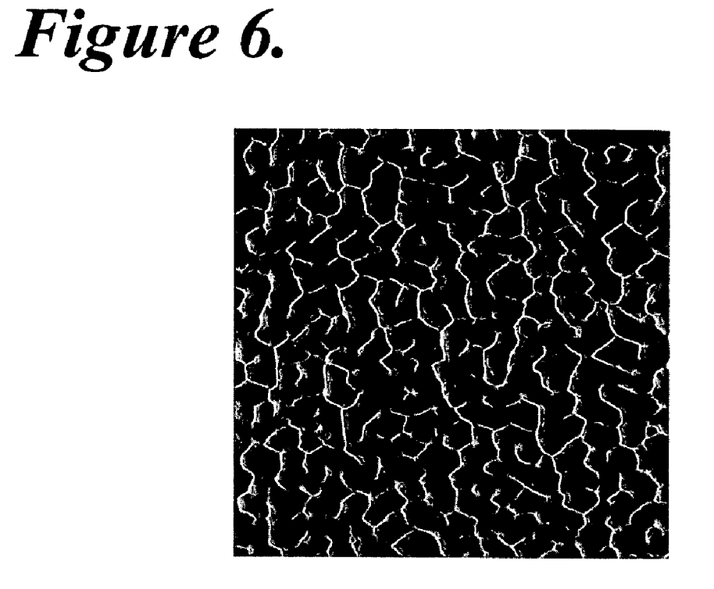
FIG. 6 is a 1.0 μm×1.0 μm Atomic Force Microscope (AFM) image of AlGaN with various Al compositions grown under the optimized conditions of pre-seeding Al on a Si(111) wafer in accordance with the present invention.

After obtaining monocrystalline AlN grown on the Si(111) wafer, an AlGaN layer is grown on the top of the AlN at a preferred temperature of about 1300±20° K. The AlGaN layer thickness can be varied from about 80 nm to 160 nm with Al composition of about 20%~60%. However, the Al composition is constant in the AlGaN layer, but its thickness should be proportional to the reciprocal of the Al composition in the AlGaN layer. That is, the thicker AlGaN layer, the smaller Al composition in the layer. Selection of the AlGaN thickness and composition depends on whole device structure expected on the Si(111) wafer. This AlGaN layer reduces the lattice constant from that of AlN to close to that of GaN and introduces a compressive strain to subsequent device structure. FIG. 6 shows an example AlGaN surface morphology of the present invention. As observed in this AFM image, the 2-D growth mode is retained.

The thermal mismatch between GaN and Si is the main of the nitride film cracking on the Si wafer. Due to the smaller thermal expansion coefficient of Si then that of GaN, large tensile strain generates in the GaN film, and the resulting film cracks when the sample is cooling down from the growth temperature, about 1300° K, to room temperature.

Figure 7A:
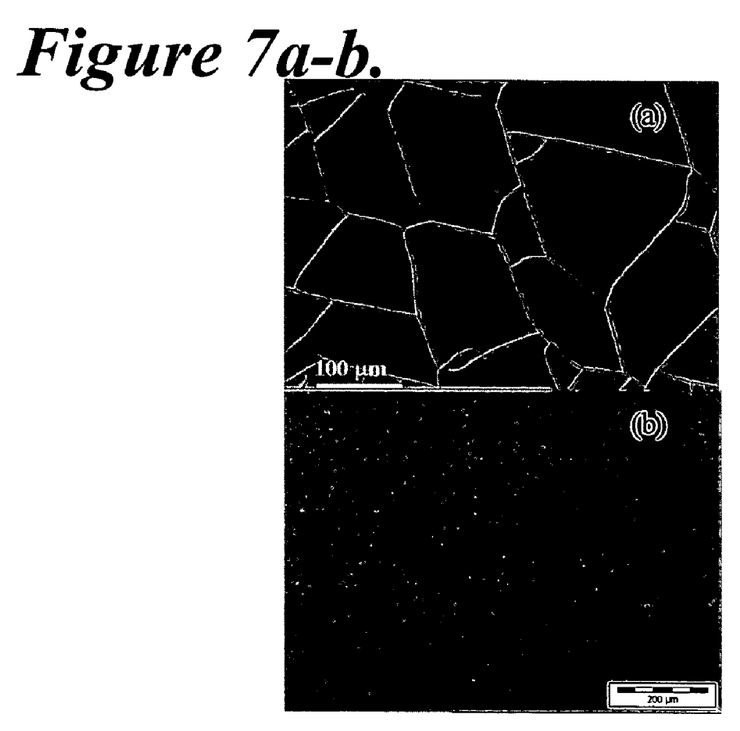

The typical morphology of GaN film grown on Si substrates with an AlN buffer layer is shown in FIG. 7(a). Dense cracks are observed in the GaN film. The way to reduce the cracking is to relax or compensate the tensile stress from the Si wafer. AlN and GaN have different thermal expansion coefficients at different temperatures, and the thermal expansion coefficient of AlN becomes larger that that of GaN when temperature is higher then 900° K. Inserting such an AlN layer introduces compressive stress to subsequent GaN layer. Besides the AlGaN layer of the invention, a repeating multiple-layer structure is adopted to compensate the tensile stress from the Si substrate.

One preferred embodiment of the invention has one AlN layer and one GaN layer grown at different temperatures in every growth cycle. At first, the wafer is subjected to a flux of ammonia and aluminium only to grow a thin AlN layer at a preferred temperature of about 900±20° K. Then, the flux is changed to gallium and ammonia to continue the epitaxial growth of GaN at a preferred temperature of about 1300±20° K. This bi-layer structure can be repeated more than one time. The repeat period depends on the thickness of expected device structure. Within the repeated structure, dislocations generated at the surface of the Si wafer are also partially stopped at the AlN/GaN interfaces. As a result, when the temperature is cooling down, the compressive stress from the AlN layers compensates the tensile stress from the Si substrate within this repeated structure.

Figure 8:
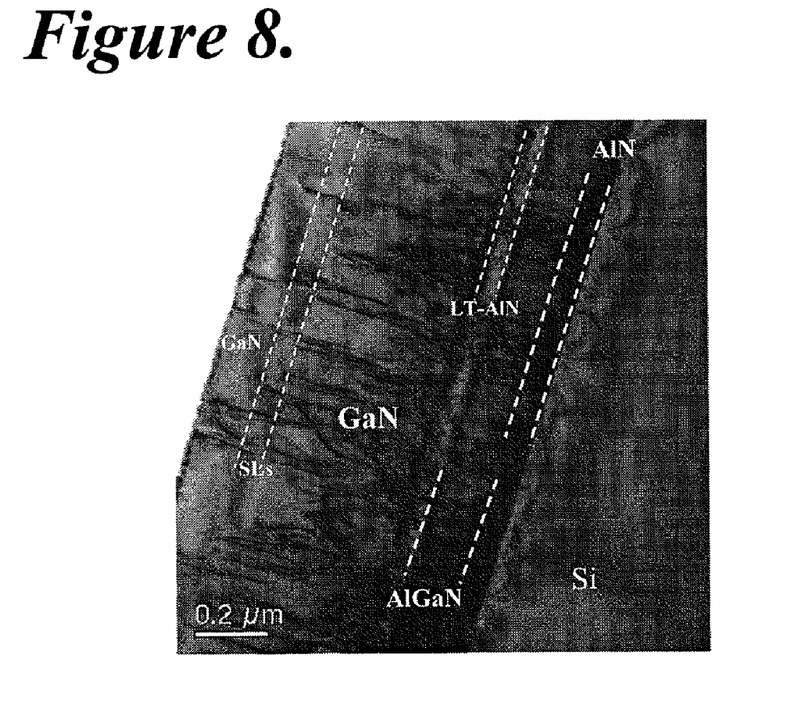
FIG. 8 is a cross-section TEM image of the GaN layer with the transition structure on a silicon substrate in accordance with the present invention.
Figure 9:
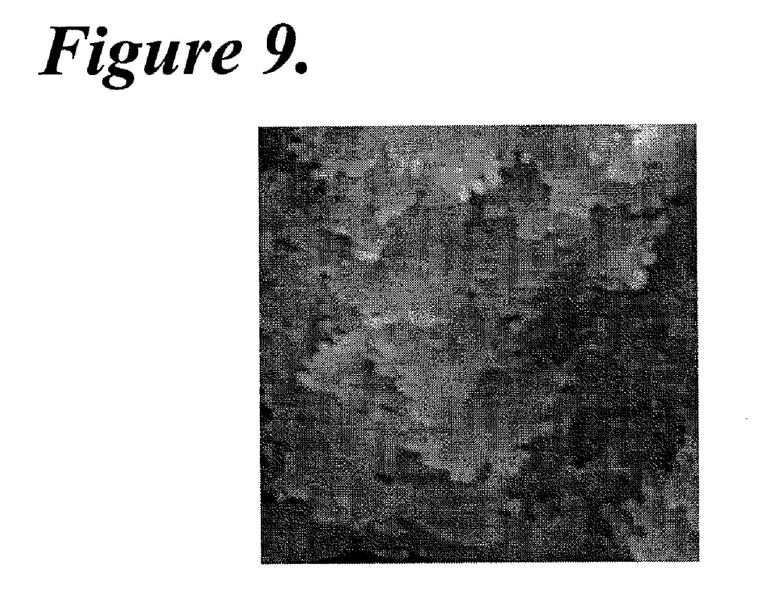
FIG. 9 is a 1.5 μm×1.5 μm AFM image of a GaN layer with the transition structure on a silicon substrate in accordance with the present invention.

Another preferred embodiment of the invention utilizes a structure having two periods of AlN/GaN bi-layer. FIG. 7(b) shows optical micrographs of the GaN layer morphology. The crack density is greatly reduced, and some areas are crack-free. FIG. 8 shows a cross-section TEM image of the GaN layer with the transition structure on a silicon substrate, in which the dislocation density is reduced from ~10$^9$ cm$^{-2}$ in the GaN layer below the superlattices to ~10$^8$ cm$^{-2}$ in the GaN layer above the superlattices. FIG. 9 is a plan-view AFM image, which shows a similar surface morphology to that of the state of the art GaN grown on sapphire.

The structures containing gallium, aluminum and nitrogen are preferably grown using MOCVD. When using MOCVD, the gallium, aluminum and nitrogen-containing structures are obtained by applying precursor materials that can include trimethyl gallium (TMG), trimethyl aluminum (TMA) and ammonia (NH$_3$).

In the next step, an AlGaN/GaN superlattice having two to twenty periods is grown on the top of the support structure grown previously at a preferred temperature of 1300±20° K. Preferred embodiments of the invention use at least five periods. A typical superlattice has ten periods. The function of the superlattice structure is to introduce multiple interfaces with different strain across the interfaces. This kind of interface absorbs some dislocations and then decreases the dislocation density.

Figure 10:
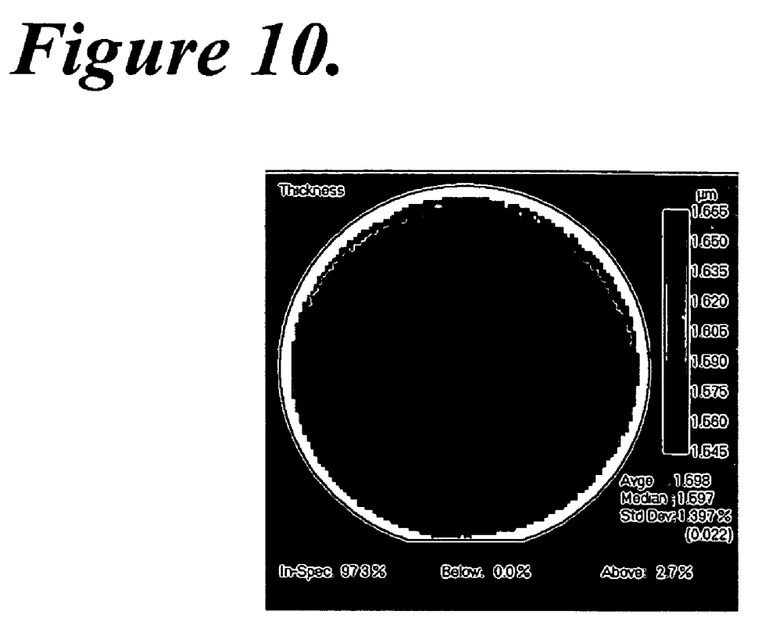
FIG. 10 is thickness mapping image of a GaN layer with the transition structure on a 2-inch silicon wafer in accordance with the present invention.

Finally, a GaN layer is grown at a preferred temperature of 1300±20° K, if desired. FIG. 10 shows a thickness mapping of GaN grown on a 2-inch Si wafer in accordance with the invention. The total thickness of the epitaxial materials is about 1.5 micrometers with a standard deviation of 5.2%, which is comparable to that of GaN grown on a sapphire substrate. In this way, high quality epitaxial layers of III-V nitrides, such as AlGaN or indium gallium nitride, InGaN, and nitride-based device structures, such as LEDs or transistors, can be grown on the silicon wafer by MOCVD technique using ammonia as the nitrogen source, trimethyl gallium (TMG) as the gallium source and trimethyl aluminum (TMA) as the aluminum source.

Figure 11:
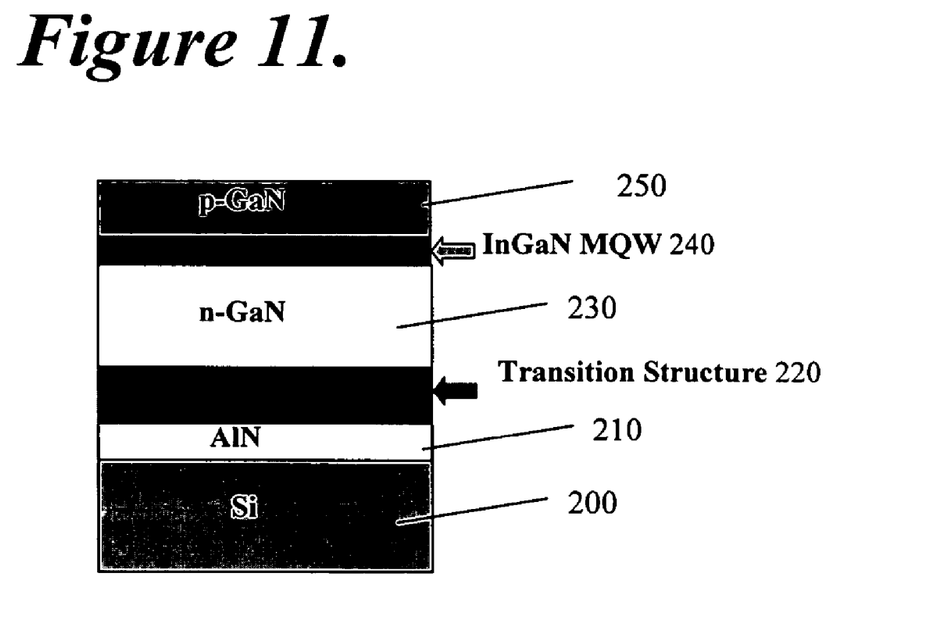
FIG. 11 is a schematic drawing of a LED structure with the transition structure on a silicon substrate in accordance with the present invention.
Figure 12A:
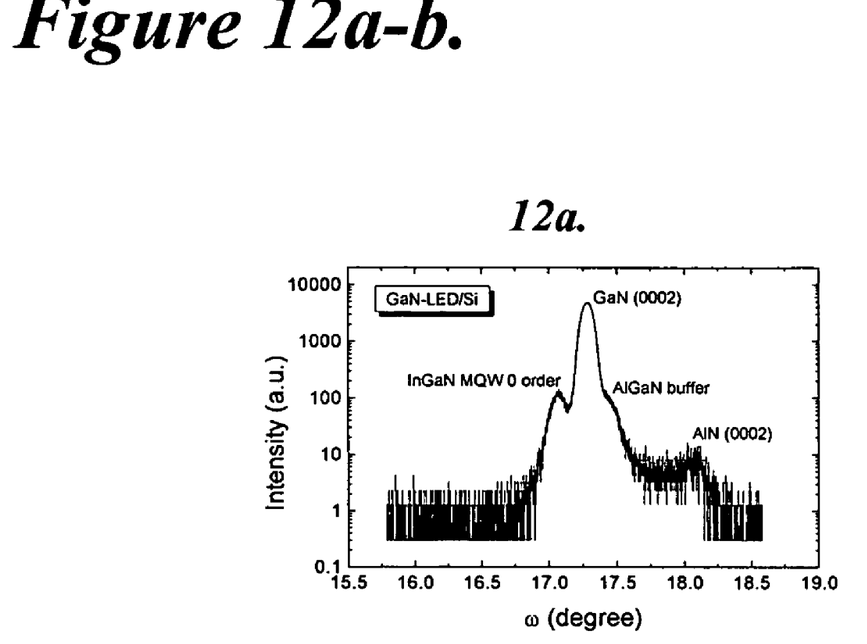
FIGS. 12a-12b are graphical illustrations of X-ray reflectivity (a) and PL spectrum (b) measured on a LED structure with the transition structure on a silicon substrate in accordance with the present invention.
Figure 12B:
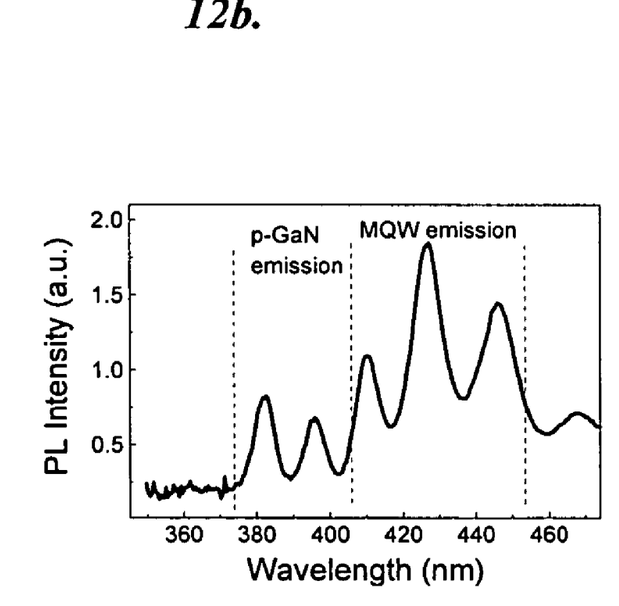

A typical preferred embodiment of the device structure is a nitride-based LED grown on a Si(111) wafer. FIG. 11 shows the schematic drawing of the LED structure on a silicon substrate in accordance with a preferred embodiment of the invention. Over a substrate is formed an AlN layer 210 and a transition structure 220. Over a subsequently formed n-GaN layer 230 is formed the InGaN molecular quantum well (MQW) 240. Finally a p-GaN capping structure is formed. FIGS. 12a and 12b show high-resolution X-ray diffraction, HR-XRD, curves and PL spectrum recorded from the LED structure. In the figures, each part of the LED is distinguished clearly, which indicates good crystal quality of the epitaxial nitride materials, and the emission is dominated by the blue color around 430 nm.

Figure 13:
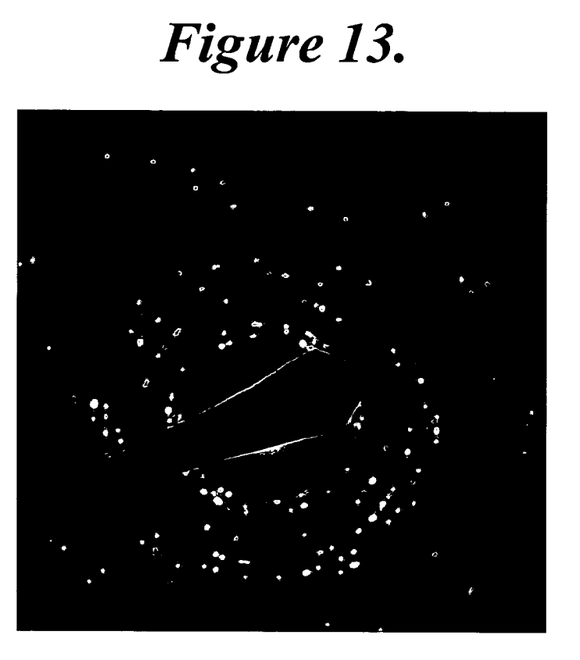
FIG. 13 shows an electron diffraction pattern of AlN grown at lower temperature, i.e. 1073° K.
Figure 14:
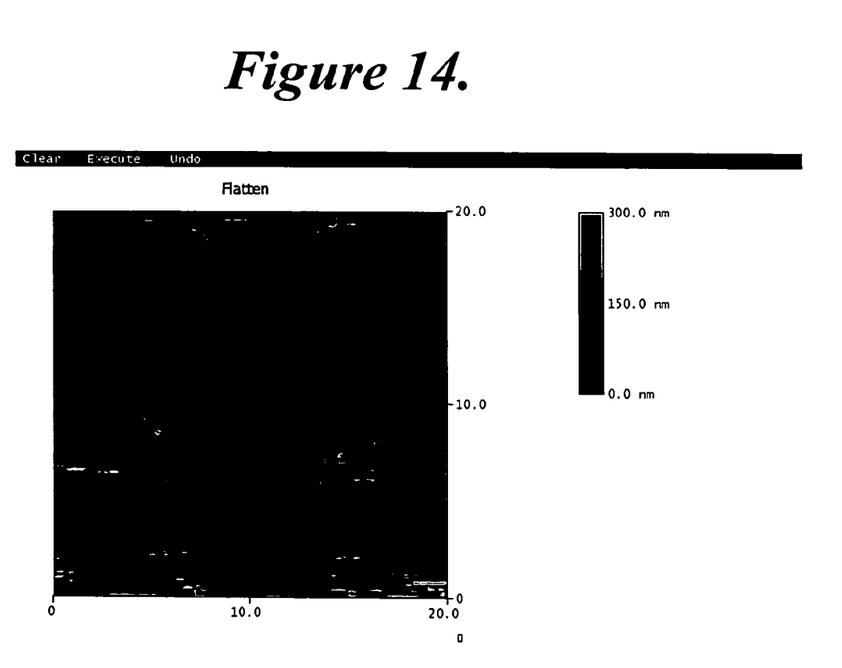
FIG. 14 shows an AFM image of a Si substrate that was heated to 1573° K.

However, it should be noted that the temperature for growing AlN depends on the function of the AlN. When the AlN is used for the first layer on the Si Substrate, a higher temperature is used for growth, and there are fewer defects in the AlN. The temperature can thus be from about 1220° K to 1473° K when only AlN itself is considered. In the invention, only a few (typically 1 to 2) layers of Al is applied to suppress Si nitration. As a result, the temperature is preferred to not be less than and 1300° K, otherwise the formation of Al—N bonds cannot overwhelm the formation of Si—N bonds. The upper limit of the temperature can be up to 1450° K. If the temperature is too high, Al diffusion into the Si substrate becomes too strong, resulting in poor morphology For example, FIG. 13 shows AlN grown at lower temperature, i.e. 1073° K, where 200-nm AlN is grown on Si. By TEM, electron diffraction shows disorderly patterns, which indicates polycrystalline material. FIG. 14 shows the effect of too high temperature, where a Si substrate is heated to 1573° K. The AFM image in FIG. 14 shows that the surface of the Si is destroyed. As a result, AlN formed over this Si layer will be very poor.

FIG. 15 shows the temperature dependence of the defect density in AlN as a function of growth temperature. The highest defect density is normalized to 100 when the growth temperature of 900° K is used. The most preferred 1300° K temperature is near the bottom of the curve, with the minimum defects occurring at about 1300 to 1350° K. A defect density of 20 a.u. or less is encompassed by the preferred about 1220° K to 1473° K temperature range. If the device can tolerate a higher defect density, a wider temperature range can be used. For example, a defect density of 30 a.u. can be attained using a temperature than no less than about 1150° K. If a defect density of 50 a.u. can be tolerated, a temperature of no less than about 1100° K can be used.

As a result, the invention solves the following problems:

The large lattice mismatch (17%) between GaN and silicon is solved by using AlN as the first buffer layer with a 5:4 coincidence between AlN(0001) and Si(111) lattice to reduce the lattice mismatch to 1.3%.

The large thermal mismatch (30%~50%) between GaN and silicon and high density cracking of nitride films grown on Si substrates are solved by using AlGaN/AlN/GaN heterostructure grown at different temperatures to compensate the tensile stress from the Si substrate.

The poor wetting of GaN on silicon substrate and the nitridation of the Si surface during the growth of nitrides by using ammonia is solved by using pre-seeding Al onto the Si surface and high-temperature growth of AlN to improve the wetting property of the nitrides on Si and to avoid the reaction between ammonia and the Si surface.

Accordingly, the invention overcomes the lattice mismatch and thermal mismatch between GaN and Si by using high-quality AlN as the buffer layer while avoiding Si surface nitridation. The invention allows the growth of a high quality nitride device structure on a Si substrate by using a specially designed AlGaN/GaN/AlN strain release structure.

Also, the inventive structure can be grown in one run without any intermediate process, which is a benefit to industrial mass production.

Accordingly, in the field of group-III nitride grown on Si substrates, high quality nitride films and relevant structures are required to improve the performance of devices. Currently, these devices were very rarely achieved. Compared with the nitride device grown on other substrates, such as sapphire and SiC, the method and structure presented in the present invention has many advantages, such as low cost, larger substrate size and easier to integrate with Si-based electronic devices.

It is to be understood that the foregoing descriptions and specific embodiments shown herein are merely illustrative of the best mode of the invention and the principles thereof, and that modifications and additions may be easily made by those skilled in the art without departing for the spirit and scope of the invention, which is therefore understood to be limited only by the scope of the appended claims.

What is claimed is:

1. A semiconductor structure, comprising:
a substrate;
a transition structure including AlN, AlGaN and GaN layers; and
a superlattice structure including AlGaN and GaN layers;
wherein a GaN/AlN bi-layer in the transition structure is repeated at least once and has a thickness of 400 nm/50 nm.

2. The semiconductor structure of claim 1, wherein the substrate comprises Si(111).

3. The semiconductor structure of claim 1, wherein an AlGaN/GaN bi-layer is deposited in the superlattice for at least for five periods.

4. The semiconductor structure of claim 1, further comprising at least one additional layer deposited on the structure;
wherein the additional layer is selected from the group consisting of GaN, AlN, AlGaN, and InGaN.

5. A method of producing a semiconductor structure, comprising:

providing a substrate;
depositing a transition structure including GaN/AlN bi-layer and AlN, AlGaN and GaN layers; and
depositing a superlattice structure including AlGaN and GaN layers;
wherein deposition of AlGaN/GaN bi-layer in the superlattice structure is carried out at a substrate temperature of 1280-1320 K and all depositions use Metalorganic Chemical Vapor Deposition.

6. The method of claim 5, wherein the substrate comprises Si(111).

7. The method of claim 5, wherein applied precursors are trimethyl gallium, trimethyl aluminum and ammonia.

8. The method of claim 5, wherein deposition of AlGaN and GaN in the transition structure is carried out at a substrate temperature around 1300° K.

9. The method of claim 5, wherein deposition of AlN in the transition structure is carried out at a substrate temperature about 900° K.

10. The method of claim 5, wherein deposition of GaN/AlN bi-layer in the transition structure is repeated at least once.

11. The method of claim 5, wherein deposition of AlGaN/GaN bi-layer in the superlattice structure is carried out at least for five periods.

12. The method of claim 5, further comprising depositing at least one additional layer on the structure;
wherein the additional layer is selected from the group consisting of GaN, AlN, AlGaN, and InGaN.

13. A method of producing a semiconductor structure, comprising:
providing a substrate;
subjecting said substrate to a flux of aluminium precursor without ammonia;
applying a flux of ammonia and aluminium simultaneously to said substrate;
depositing a transition structure including AlN, AlGaN and GaN layers; and
depositing a superlattice structure including AlGaN and GaN layers;
wherein deposition of AlGaN/GaN bi-layer in the superlattice structure is carried out at a substrate temperature of 1280-1320 K and all depositions use Metalorganic Chemical Vapor Deposition.

14. The method of claim 13, wherein the substrate comprises Si(111).

* * * * *